United States Patent [19]
Wrycraft

[11] Patent Number: 6,011,689
[45] Date of Patent: Jan. 4, 2000

[54] COMPUTER COMPONENT COOLING FAN CLOSURE DEVICE AND METHOD THEREOF

[75] Inventor: Sean C. Wrycraft, Harrow, United Kingdom

[73] Assignee: Sun Microsystems, Inc., Mountain View, Calif.

[21] Appl. No.: 09/067,474

[22] Filed: Apr. 27, 1998

[51] Int. Cl.[7] ........................................ H05K 7/20
[52] U.S. Cl. .......................... 361/695; 361/687; 454/353
[58] Field of Search .................... 454/184, 353; 174/15.1, 16.1; 165/80.3, 121–126; 364/708.1; 361/687, 690–695, 697, 717–719

[56] References Cited

U.S. PATENT DOCUMENTS

| | | |
|---|---|---|
| 5,168,424 | 12/1992 | Bolton . |
| 5,210,680 | 5/1993 | Scheibler . |
| 5,793,610 | 8/1998 | Schmitt . |
| 5,808,867 | 9/1998 | Wang . |
| 5,890,959 | 4/1999 | Pettit . |

*Primary Examiner*—Gerald Tolin
*Attorney, Agent, or Firm*—Blakely Sokoloff Taylor & Zafman

[57] ABSTRACT

Disclosed is a system for assisting in preventing over heating of the internal electrical components of a computer in the event of a failure of one of the adjacent fans of an array of fans employed to circulate cooling air over the components. The fans include openings through which air is forced from their inlet sides to their outlet sides. The system includes a vent for each fan arranged adjacent to and aligned with the fan opening at its outlet side. The vents are open and closed by vanes, having hinged slats construction to allow them to fall downwardly by their own weight or additional assistance. The vanes are kept open by the airflow created by the fans. Upon the failure of a fan, the absence of airflow through the opening thereof allows the slats of the vane to drop to close off the fan opening and prevent airflow into the fan opening from its outlet side.

23 Claims, 7 Drawing Sheets

COMPUTER COMPONENT COOLING FAN CLOSURE DEVICE AND METHOD THEREOF

BACKGROUND OF THE INVENTION

This invention relates to computer systems and more particularly to such systems that employ one or more internal air fans for cooling the internal electrical heat generating components of the systems. In computer systems that are required to operate for long periods of time or continuously, for example servers, which systems usually employ an array of fans, a great concern is the effect a failed fan may have in allowing over or prohibitive heating of the components resulting in a reduction in performance and even their failure. In a system employing an array of adjacent fans, for example, where the array is employed in a rack containing a large number of electrical components, the failure of a single fan can result in an objectionable over heating of the components. While the computer system of the failed fan may be provided with well known temperature and fan rotation sensors, alarms and heat shut off devices, some of these protective devices require immediate attention or effect a shutting down of the system, which may not be practical or an acceptable option. For these reasons it is a common practice to provide a redundancy fan system, which while solving one set of problems is not without some serious drawbacks, such as additional cost, the use of internal computer space where space in modern computers is at an ever increasing premium, complexity in control and performance of the fans and unpredictable flow rate thereof.

The ever increasing power densities of modern electronics being installed in today's computer systems create an ever higher impedance to airflow. This results in the creation of a high static pressure condition at the outlet side of the fan or fans. As a result of this condition, air in the form of recirculating air at the outlet side of a failed fan is forced in a direction reversed from the normal airflow of the fan due to the lower impedance the opening of the failed fan offers. The recirculating air at the inlet side of the failed fan is thus allowed to mingle with the inlet air of an adjacent operating fan causing a reduction in the air mass and cooling capacity available to be circulated over the electrical components by the other fan. In addition, the recirculated air when reintroduced by the operating fan to effect cooling of the components will continue to gain heat adding to the problem.

BRIEF SUMMARY OF INVENTION

With reference to the above background, it is an object of the present invention to provide a computer system having a heat generating electrical component and a cooling fan for the component, which fan can either push or pull air over the component, the computer also includes an area for providing air to the fan, in which associated with the fan is an airflow closure member arranged at one of the sides of the fan and a support member associated with the airflow closure member, the air flow closure member being constructed and arranged to allow a flow of cooling air to be brought by the fan relative to the component and upon the failure of the fan to close off the one side of the fan in a manner to prevent air from passing through the fan. Accordingly, the invention provides a simple, low cost airflow closure arrangement that takes up very little space and creates very little airflow impedance.

Another object of the invention is to provide an array of cooling fans, arranged adjacent to each other, for a number of heat generating electrical components, the components being located at the outlet sides of the fans to push cooling air over the components, each fan having a vent and each having an aforesaid closure member comprising a vane, the slats of the vanes being displaceably mounted in a manner that airflow from the fans will force the slats into open positions allowing airflow from the fans to the components and on the failure of a fan, the slats of the failed fan are caused to close, for example, by gravity or positive positioning means to prevent any recirculation of air from the outlet side of the failed fan passing to its inlet side.

It is another object of the invention to provide a component air cooling arrangement for a computer system, wherein the components are arranged at the outlet side of an array of airflow fans and where they create a relatively high density air impedance condition and a relatively high static air pressure condition at the outlet sides of the fans.

A still further object of the invention is to provide for each slat a positive force exerting member, for example, a mechanical spring for the small thin very light hinged slats of the aforesaid vanes to force them to close on the failure of an associated fan, and wherein a set of slats for a fan is contained in a common vent frame.

An additional object of the invention is to provide vanes for the fans in a manner that they will reduce the swirling effect of the airflow and improve stability of airflow passing into and/or through the computer.

BRIEF DESCRIPTION OF THE DRAWINGS

These objects and other features and advantages of the invention will be better understood when the following description thereof is read along with the following drawings of which.

DETAIL DESCRIPTION OF THE INVENTION

Figure 1:
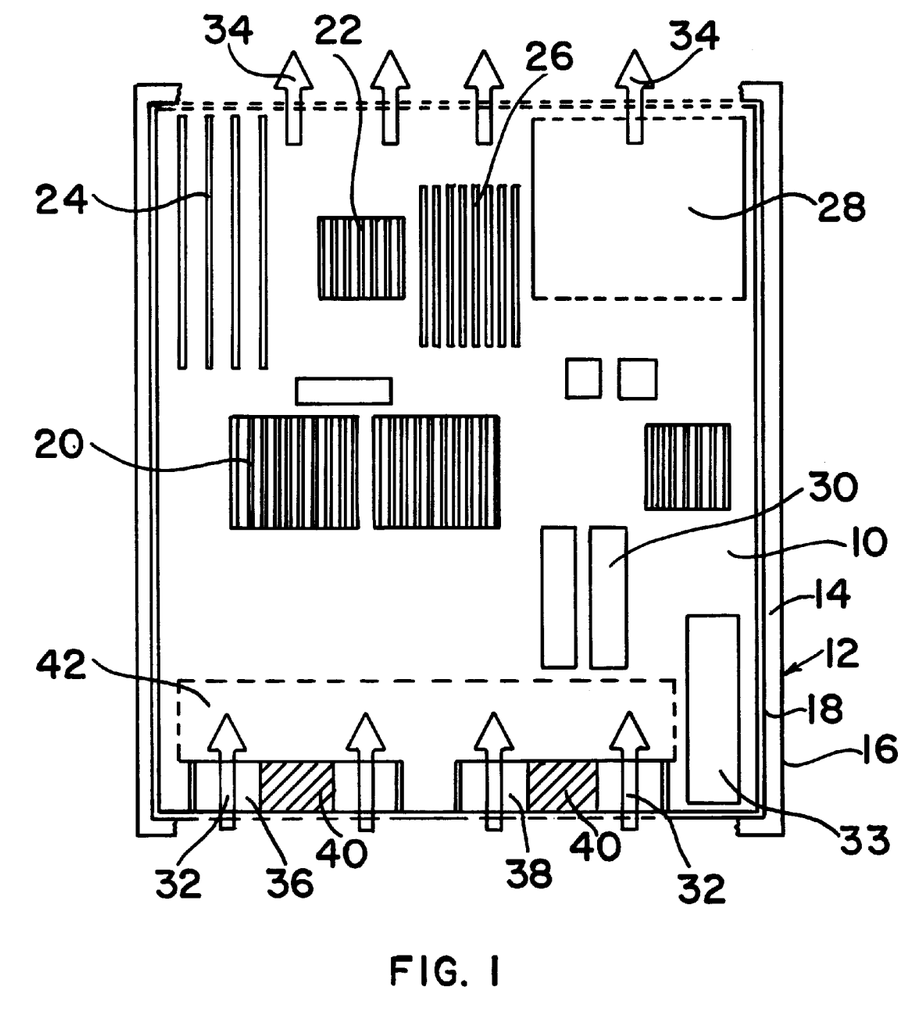
FIG. 1 a schematic plan view of the interior of a computer illustrating the airflow patterns of an array of operating fans.

With reference to FIG. 1 there is illustrated a main horizontally arranged printed circuit board 10 of a computer system 12, the cover of the computer having been removed to diagramically reveal some of its electrical components. The components are contained within an enclosure 14 shown to include side walls 16 and upright sides of a chassis 18. The electrical components revealed represent only some of the units commonly employed and include several processor modules 20, ASIC modules 22, PCI cards 24, DRAM 26, power supply units 28, disk drives 30 and CD-ROM drives 33. The units 20 and 30 are located in a high density area, which area is immediately behind the fans and plays a significant role in the creation of a high static air pressure zone adjacent the fans.

The lower end of the computer 12, as one views FIG. 1, represents the front of the computer and at this end there are provided four fans directional arrows 32 that indicate the entrance of outside cooling air to the interior of the computer, the opens for which are represented by broken lines. At the other end of the computer, i.e. the back, the four directional arrows 34 serve to indicate the interior heated air leaving the computer through side wall openings, these openings also indicated by broken lines. The arrows 32 at the front of the computer 12, that is the airflow they represent, also serve to indicate the source of the airflow, namely two parallelly arranged electrical fans 36 and 38 of an array of fans, two arrows per fan, the center cross sections of each fan representing the fan rotor 40. The fans are shown to be adjacent to each other, the connotation of which has the meaning that their proximity to each other is close enough or otherwise arranged to create the potential for air to back flow or recirculate through a failed fan. In FIG. 1 the two fans 36 and 38 are both operational and hence the four airflow paths of the fans, as represented by the arrows 32, are shown to be parallel, directionally straight, and unimpeded relative to their functions in providing cooling air to the electrical components and particular to the high heat generating ones arranged directly in front of the fans 36 and 38. The fact that the fans are all operational prevents any airflow in a direction opposite or reverse to the direction of the arrows 32.

Figure 7:
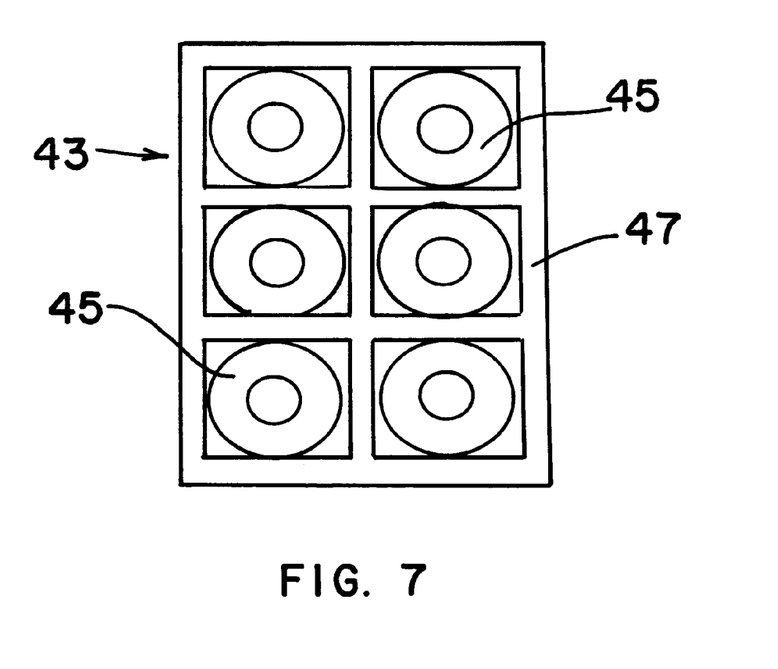
FIG. 7 is a schematic elevational view of a fan tray.

An outlined rectangular zone or area 42 between the fans and components is provided in the form of a plenum to help equalize the pressure across the two fans. The construction, operation, dimensions, capacity and selection of the number of fans employed, are well known and can be of the type supplied by the Hendry Telephone Products Company of Goleta, Calif. and commonly come in the form of fan panels or fan trays. A schematic showing of a typical fan tray 43 of an array of six fans 45 appears in FIG. 7. The tray has an attaching surface 47 for supporting the fans. It will be appreciated that while six fans are illustrated, the fan arrangement may consist of several different numerical forms, for example, may comprise only two horizontally or vertically adjacently arranged fans. The high density area and the high static pressure zone of the electrical components are factors that go into the airflow rate selected for the fans. While reference has been made to electrical fans it will be appreciated that electrical blowers and other forms of air movers can be used, which sometimes herein are referred to as air moving facilities.

Figure 2:
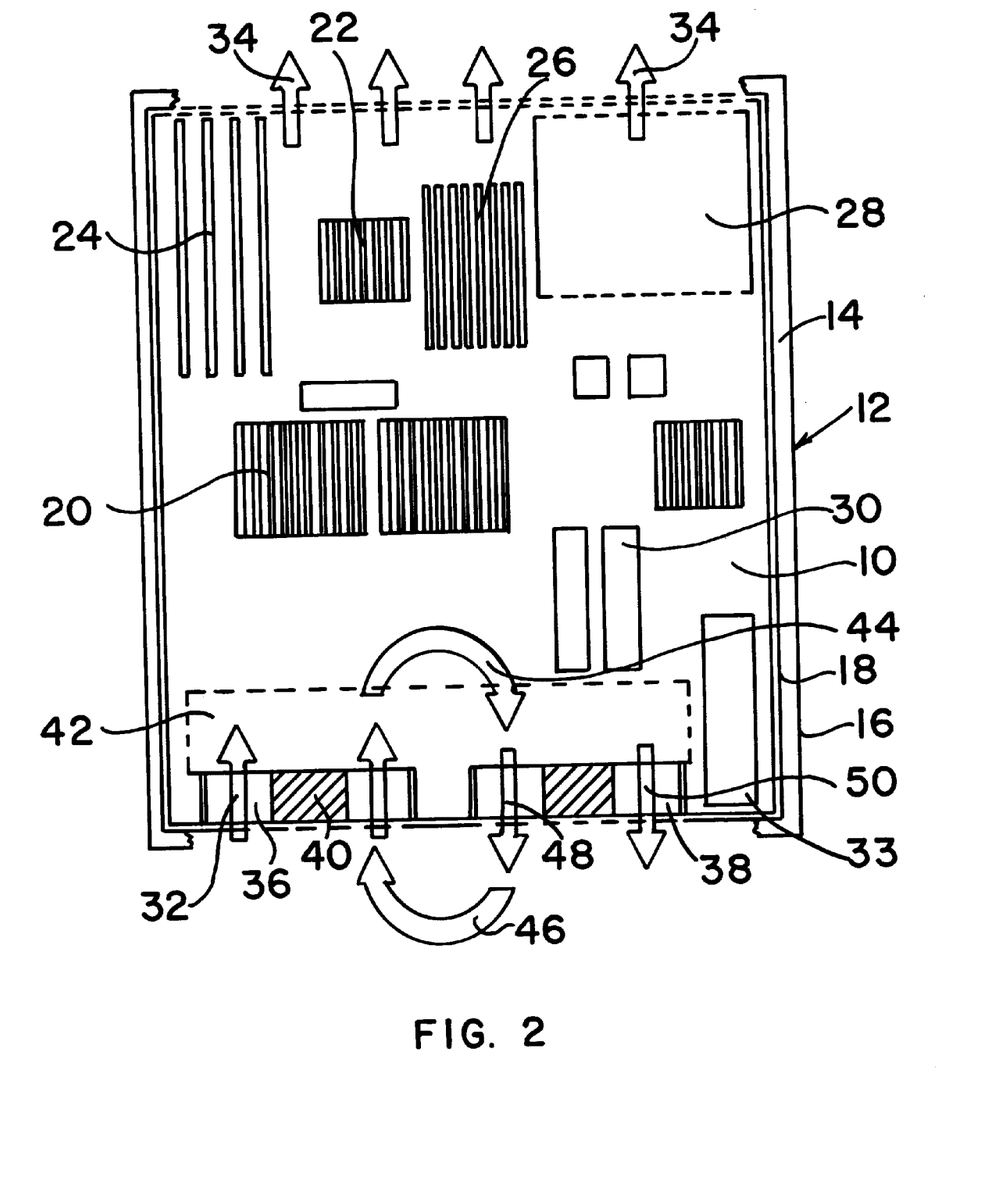
FIG. 2 is a schematic plan view similar to FIG. 1 illustrating the airflow patterns of an array of fans upon the failure of one of the fans.

In FIG. 2 like elements and conditions have like reference numbers as found in FIG. 1. The only difference between the two figures is that FIG. 2 portrays the condition of a failure of one of the fans, namely fan 38. This results in a recirculation airflow problem at the back outlet area of the failed fan, as is indicated by the curved arrow 44. The recirculation condition is a result of at least three concomitant factors. The first is the high density area that exists immediately in front of the fans, which possesses a high impedance to airflow by the heat generating electrical components, particularly the CPU units 20 and disk drives 30. The second factor is the high static air pressure condition created by the high density components and their close proximity to the outlet sides of the fans. Thirdly, the failed fan 38, when the air pressure adjacent to its outlet airflow side is considered, forms an alternative low impedance air path. In this instance the failure of a fan to rotate acts as an open vent allowing heated airflow from the inside of the enclosure to flow in a reverse direction to rejoin and co-mingle with the inlet airflow resulting in a reduction in the air mass available to remove heat from the electrical components.

The only restriction to the recirculating airflow is the finite area of the fan opening of the failed fan and in the case of a seized fan rotor the fan blades. Also to be noted in the event of a failed fan is the likelihood that the recirculating air in addition to gaining heat from the electrical components, will continue to gain heat as it passes through the heated enclosure and hence rejoins the inlet air. FIG. 2 is designed to illustrate the aforesaid conditions by a second curved arrow 46 suggestive of the flow of air between the two fan 36 and 38 at their inlet sides on the failure of the fan 38. The path of the recirculating airflow is completed by the two additional arrows 48 and 50 indicating the reverse airflow paths through the two opposed sides of the fan rotor, the difference in size of the arrows portraying that the side of the failed fan closest to the operating fan is much more significant as to the recirculating airflow.

The failure of a single fan can have a detrimental effect on the desire to prevent the temperatures of the electrical components from exceeding a permissible level. Such increased component temperature will cause reduced reliability and possibly even rapid failure. In a fan arrangement where one fan is coupled with a failed fan negligible cooling air will flow through the system, which effect while reduced when there are more than two fans sharing a plenum, will still be significant even, for example, with a typical array of six fans.

Figure 3:
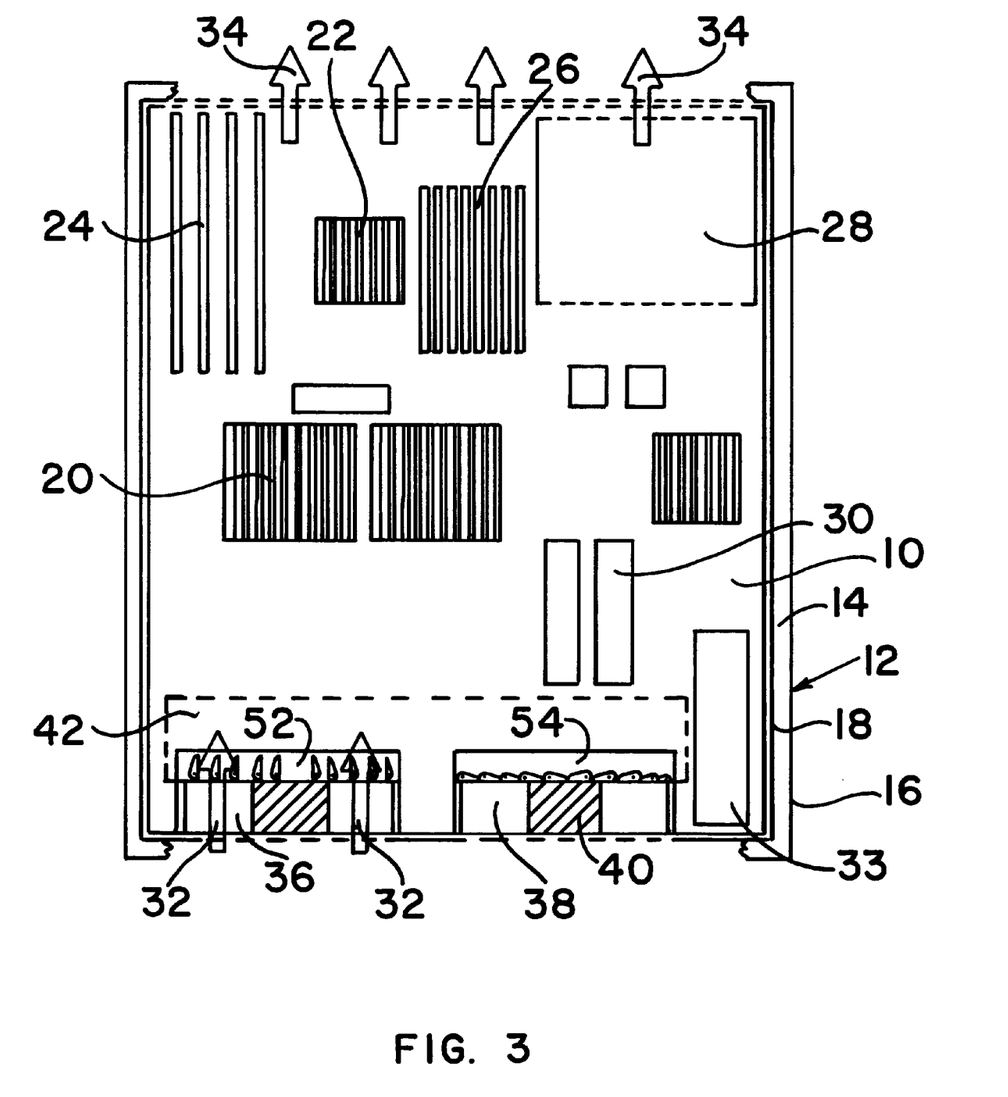
FIG. 3 is a schematic plan view similar to FIG. 2 illustrating the airflow patterns of an array of fans upon the failure of one of the fans incorporating features of the present invention.

With reference now to FIG. 3, which illustrates one form of an embodiment of the present invention in the computer 12 shown in FIGS. 1 and 2, in which like numbers identify the same elements and conditions of FIGS. 1 and 2. As in the case of the computer 12 of FIGS. 1 and 2, the fan 38 shown in FIG. 3 is represented to be a failed fan while the fan 36 the operational one. The form of the invention employed in FIG. 3 comprises the mounting of a vent-vane assembly at the outlet side of each fan, the assemblies being identified as 52 for the fan 36 and 54 for the fan 38, sometime herein the vane is referred to as an air closure arrangement. The vent-vane assembly can be formed out of sheet metal or plastic.

Figure 4:
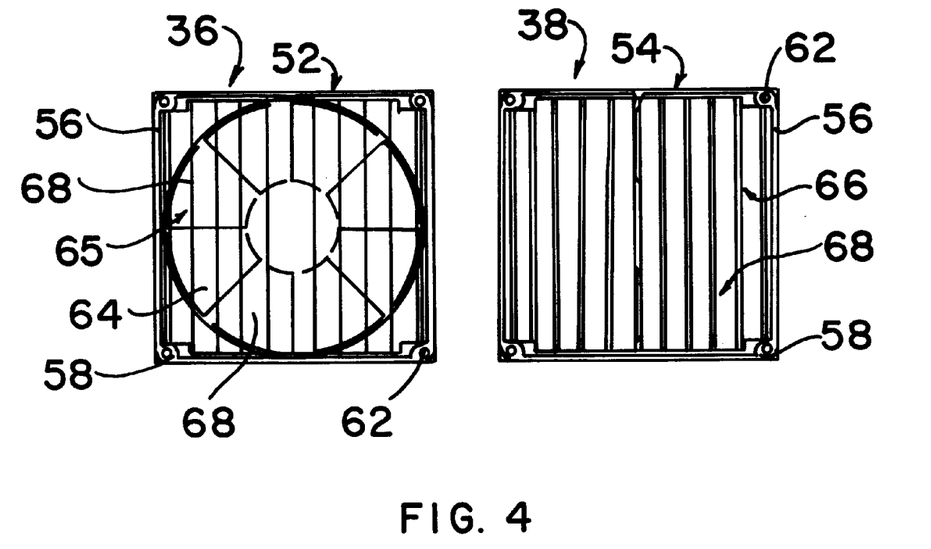
FIG. 4 is a schematic end view of the two fans of an array of fans illustrated in FIG. 3 as viewed from the inside of the computer incorporating features of the present invention.
Figure 5:
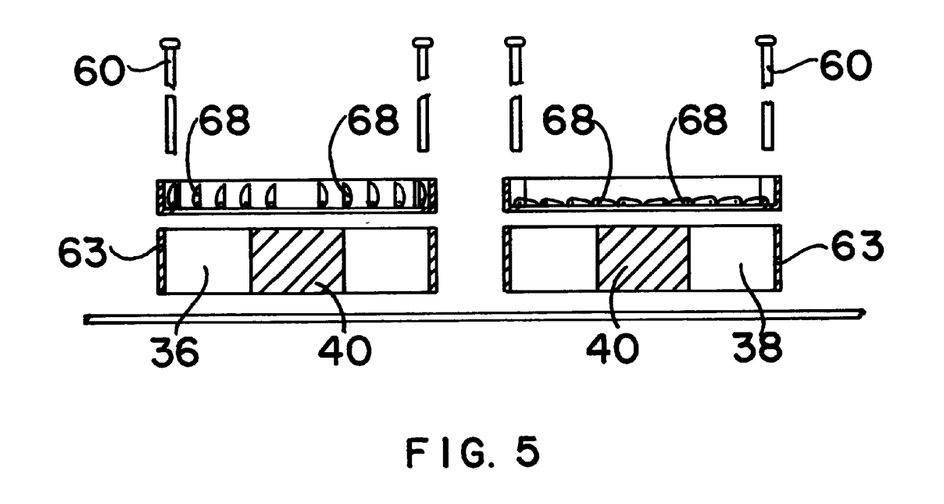
FIG. 5 is a schematic elevational side view, expanded and partly in section, of the two fans illustrated in FIG. 4.

FIGS. 4 and 5 better illustrate the principle features of the vent-vane assemblies. As shown, each assembly 52 and 54 includes a square shaped thin sheet metal or plastic vent 56 and as indicated in FIG. 4 takes the form of a parameter frame 58 having a narrow interior depth (shown best in FIG. 6) and an interior side open to the associated fan, and its opposite side open to the interior of the computer. The square area of each vent 56, aside from its thin walls, is entirely open relative to its associated fan and the interior of the computer. An example of a typical size or volume for the vents would be 120 mm×120 mm×approximate 10 mm wall thickness. As indicated in FIG. 5, each vent is secured by four fasteners 60 i.e. either screws or bolts to the rear side of the associated fan, for which purpose the vents have corner holes 62 that align with four corresponding holes, not shown, in the sheet metal or plastic housing 63 of the associated fan and by which means the vents are tightly secured to the fans. In FIG. 5, while the vents are shown separated from the fans this is done for purposes of clarity. The representation of the fans shown in FIG. 5 indicates the central rotors 40 and in the two open spaces on either side of the rotors, fan blades, one blade 64 being shown in FIG. 4 as to the fan 36. If desired, instead of a one piece vent, with a fan opening or openings, the vent can consist of one or two spaced apart supports, for example, one at the top and one at the bottom of a fan or fan tray for pivotally supporting the slats of a vane or vanes.

As shown in FIG. 3 and more clearly in FIG. 5, mounted within the frames 58 of the vents 52 and 54 are vane assemblies 65 and 66. Each vane assembly comprises a series of rotational parallelly arranged slats 68, ten being shown which in their closed positions cover the entire opening of the vents. FIG. 4 also reveals the length of the slats which are shown to extend from the top to the bottom of the vent, as one views FIG. 4. The slats are constructed and arranged to be forced to pivot to open positions by the fan airflow, which is the positions shown with the fan 36 in FIG. 5, the slats being pivoted by either gravity or an outside force from the open positions to the closed positions, which is the positions shown with the fan 38, where the slats line up at the bottom of the vent as viewed in FIG. 5. While the disclosed arrangement employs a number of slats, it will be appreciated that depending on the size of the fans a single slat can be employed.

Figure 6:
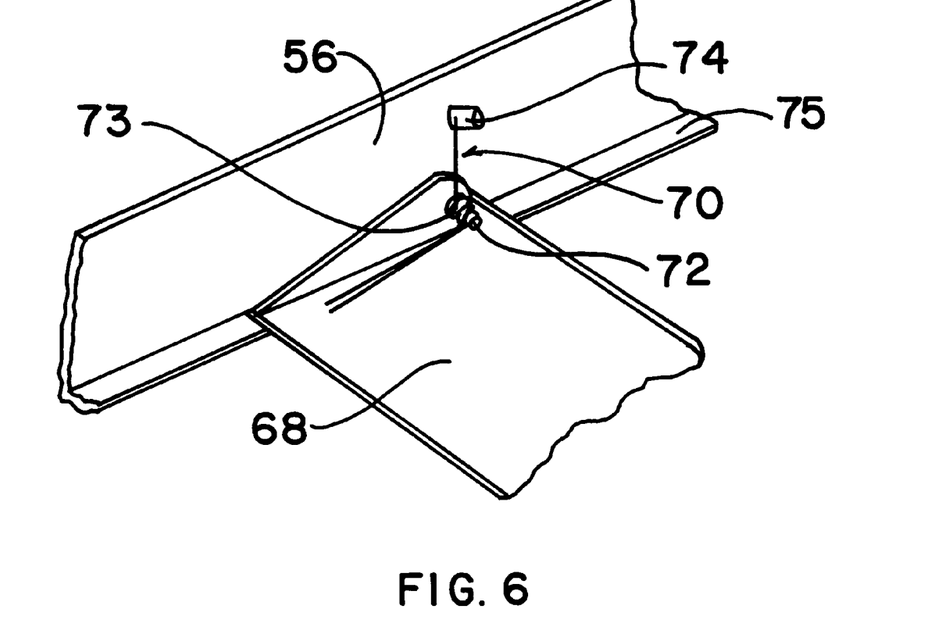
FIG. 6 is a schematic perspective view of a hinge-spring arrangement used with the slats of the vanes of the fans illustrated in FIGS. 4 and 5.

The computer system shown in FIGS. 1, 2 and 3 is meant to relate to a desk top unit where the system is usually arranged horizontally and the fans are usually located in the front vertical wall of the system. When the system is so arranged, it is desirable to provide a positioning mechanism for moving the slats, such as an elastic member that will force the slats into their closed positions in the absence of airflow and which during airflow will be force into their open positions against the force of the elastic member. An example of such a mechanism is shown in FIG. 6 where there is illustrated with one of the slats 68 a return spring assembly 70, the spring made up of usual spring steel being mounted on a pivot metal or plastic pin 72 with one of its free ends arranged on the top surface of the slat to move with the slat when rotated by airflow to its open position. In FIG. 6 the slat is shown in its closed position. This action tensions the several spring woundings 73 on the pin. The other free end of the spring is provided with a stop 74 located and constructed to contact an inside edge of the adjacent horizontal portion 75 of the adjacent wall of the vent 56, which contact controls the extent of the open position of the slat 68. As noted, each slat is provided with a spring assembly 70.

While in the usual work station system a positive slat return mechanism may be desirable, it will be appreciated in a number of other systems the slats can be constructed and arranged to return to their closed positions by gravity. This is the relationship that would exist if one assumes in FIG. 6 the vent-vane assembly instead of being arranged horizontally is arranged vertically, wherein the slat would rotate by gravity in a clockwise direction from its open position to its closed position. For example, in a computer system employing a rack mount it is usual to locate the fan tray either above or below, i.e. at the top or bottom of the system where the fans force air upwardly from the bottom or downwardly from the top. In this case the slats of the vane would be forced by the fan airflow into vertical or upright positions and in the absence of airflow would fall down by gravity to their closed positions. The use of the vent-vane assembly in a server would be another example where it is a common practice to arrange the fan tray at the bottom of the self standing upright unit. It will be appreciated by those skilled in the art that other slat force or energy sources such as counterweight or magnetic systems can be utilized.

Returning again to FIG. 3, and to better appreciate the path of airflow illustrated therein, it is suggested that the path of airflow illustrated in FIG. 2 be compared. FIG. 2 is designed to illustrate the recirculation problem of a failed fan. FIG. 3 is designed to illustrate the benefits of the employment of the vent-vane assembly of the present invention. As noted above, in FIG. 3, as in FIG. 2 the fan 36 is operational, whereas the fan 38 has failed. As shown by the arrows 32 representing the cooling air introduced into the interior of the computer, the cooling air does not recirculate i.e. is not allow to find its way back through the failed fan. This beneficial result is accomplished by the automatic self initiated operation of the vane 56 and particularly its slats 68 associated with the failed fan 38. The closing of the outlet opening of the failed fan prevents the high density-high static air pressure conditions from forcing air inside the computer back through the low impedance failed fan opening as recirculating air that could rejoin the cooling air to be introduced into the computer.

In referring again to the slats 68 and again to FIGS. 5 and 6 they are shown to take form or shape of very thin and light tears or wings in cross section with their large sections being at their bottoms, as one views FIG. 5. In this way they offer very little resistance to the flow of air when in the open positions as shown with reference to the fan 36. The heavy "bottoms" of the slats permit the slats to collapse when in their vertical positions into the closed positions shown with reference to the fan 38, again in referring to FIG. 5. In their closed positions the upper free ends of the slats assume horizontal adjacent positions closing off the vent opening. In their vertical positions the slats, as indicated with the fan 36 in FIG. 3, extend to the top of the frame of the vent 56. This relationship is better shown in FIG. 4. In regard to the arrangement of components and their power rating along with other factors such as their relationship to the fans it is calculated in a given case that a failure of the fan 38 could result in an increase in critical component temperature of 23 degrees C. and that the incorporation of the disclosed vent-vane arrangement of FIG. 3 of the present invention the temperature would rise by only 7 degrees C.

Directing attention now to FIGS. 8 and 9 where again like reference numbers relate to like elements and conditions of the earlier figures, the principle difference between the computer system of FIGS. 8 and 9 compared with the system of FIGS. 1, 2 and 3 is that in FIGS. 8 and 9 the fans or blowers 76 and 78 are arranged at the back of the computer 80. These units draw air as exhaust air movers from inlet air cooling openings in the front of the computer and discharge air from openings in the back, the inlet openings being identified by four arrows 82 and the outlet openings by two arrows 83. The front and back of the computer in FIGS. 7 and 8 have the same connotation as identified in FIGS. 1, 2 and 3. Exhaust fans or blowers are commonly used with certain types of servers. Also in the latter figures the electrical components more adjacent to the exhaust fans 76 and 78 are spaced further away from the back wall of the computer than in the earlier figures, creating an air free plenum 84, which zone is similar to the plenum 42 between the most adjacent components and the front wall of the computer 12 in FIGS. 1, 2 and 3.

Figure 8:
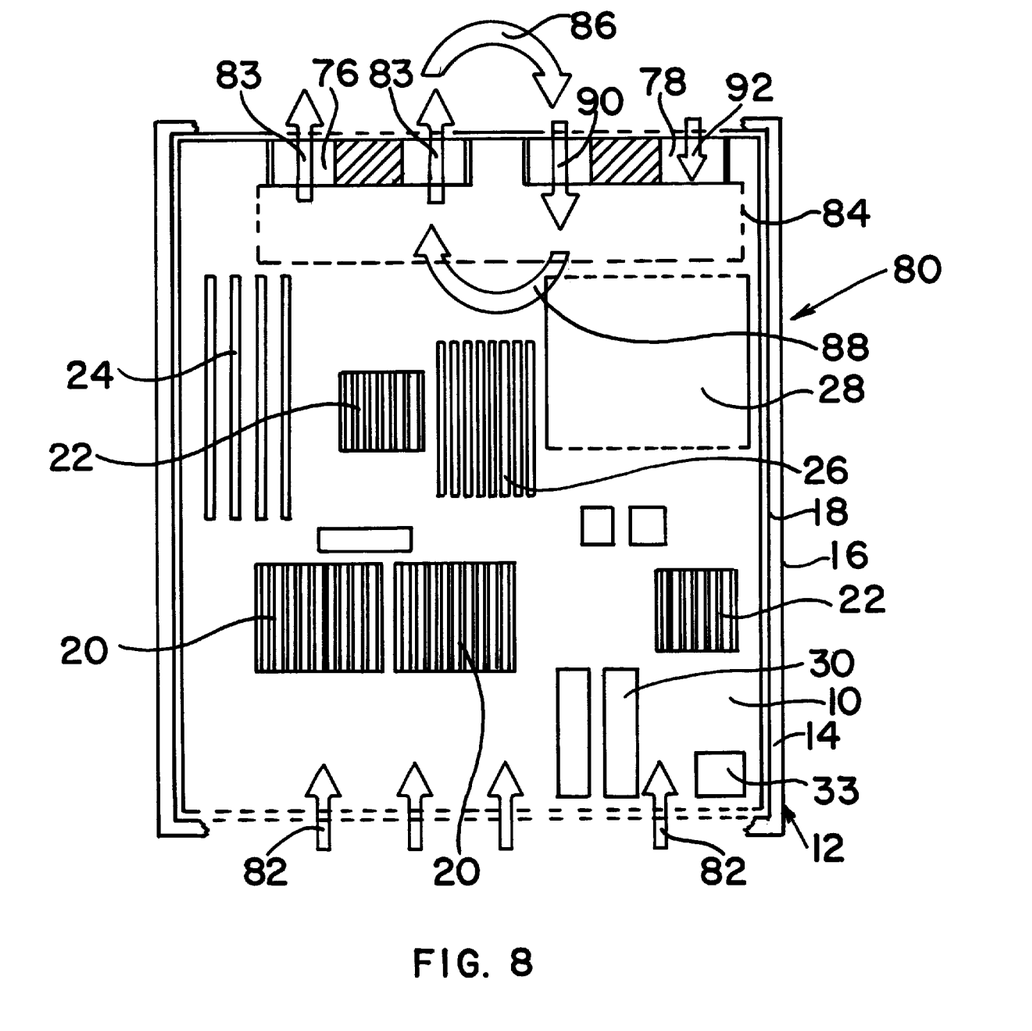
FIG. 8 is a schematic plan view similar to FIG. 1 illustrating the airflow patterns of an array of exhaust fans upon the failure of one of the fans.

In FIG. 8 the exhaust fan 78 is portrayed to have failed, hence the curved arrow 86 indicates that air exiting from the operational fan 76 has the tendency to recirculate heated exhaust air back into the interior of the computer through the blades of the fan 78 and if its rotor is seized over its rotor, where the recirculating air represented by the arrow 88 adds to the heat of the air in the zone 84 in front of the adjacent electrical components. As in the case of the failed fan of FIG. 2, most of the recirculating air passing into the interior of the computer from its left side as indicated by arrow 90, although some finds it way through the right blade side as indicated by the diminutive arrow 92.

One of the reasons for the recirculation is the fact that air inside the enclosure is at a higher temperature, due to heat dissipation from the components, but at a lower air pressure then the outside ambient temperature and pressure. This means that it is easier for the air exhausted by the working fan to pass directly back into the enclosure via the adjacent "hole" caused by the failed fan than for fresh air from outside at the front inlet side of the computer to pass all the way through the enclosure to the operating fan.

Figure 9:
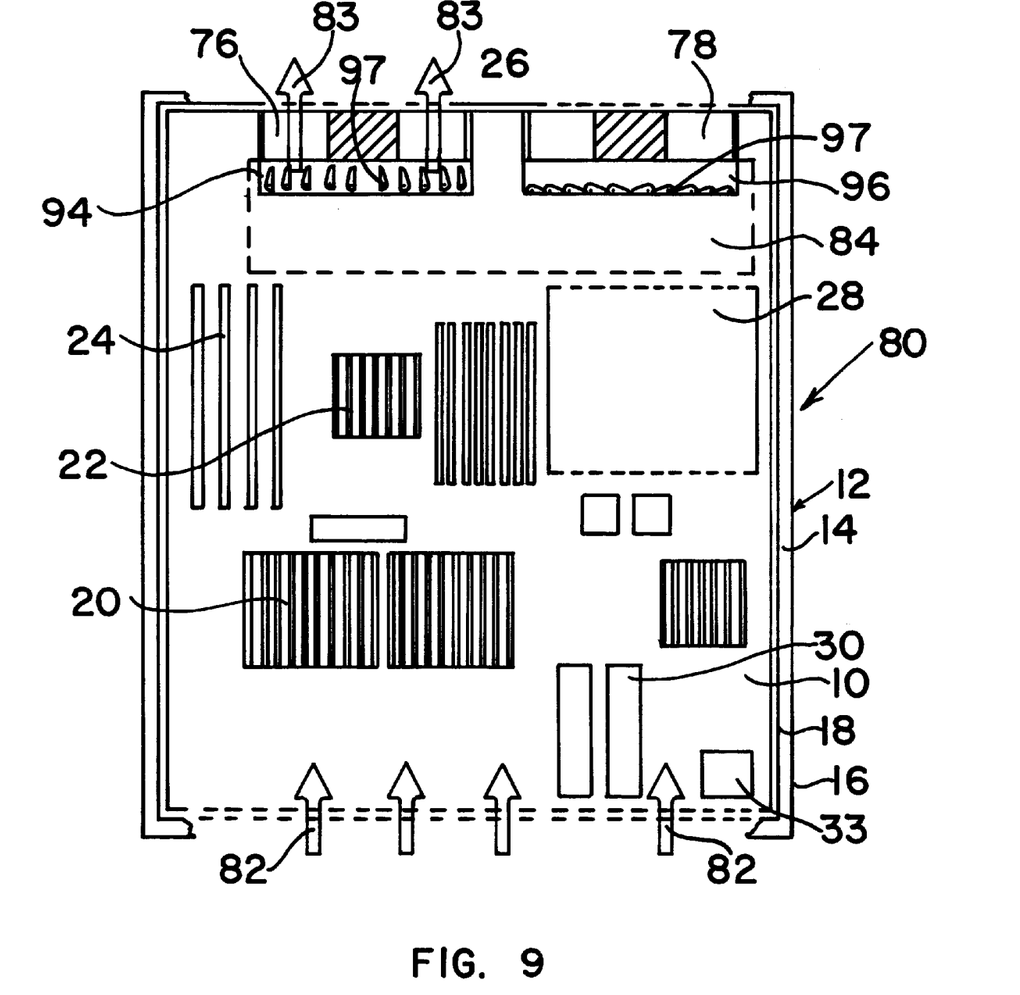
FIG. 9 is a schematic plan view similar to FIG. 8 illustrating the airflow patterns of an array of exhaust fans upon the failure of one of the fans incorporating features of the present invention.

FIG. 9 seeks to illustrate the benefit of employing a vent-vane arrangement similar to described above in FIG. 3, except the two vent-vane systems 94 and 96 are located at the back of the computer 80 at the inlet sides of the fans, although as in the case of the vent-vane arrangement of FIG. 3 the vent-vane systems can be located on either side of the associated fans. As portrayed in FIG. 9, upon the failure of the fan 78 the closing of the slats 97 of the vane 96 will prevent the recirculation of air from the outside of the computer back through the failed fan 78, thus obtaining the benefits noted above as to the operation of the vent-vane arrangement of FIG. 3.

In accordance with the provisions of the patent statutes, I have explained my invention in terms of its preferred embodiment, however, it will be readily understood by those skilled in the art to which the invention pertains that it may be practiced otherwise than illustrated and described.

I claim:

1. In a computer comprising a number of heat generating electrical components that require cooling, at least two cooling fans arranged adjacent to each other, a facility constructed to support said fans, said fans each comprising an inlet side and an outlet side, each said fan comprising a fan opening, a vent facility for each said fan, a facility for each said vent facility for supporting and locating said vent facility adjacent to an associated fan, each said vent facility comprising an opening aligned with and at least substantially as large in area as the area of an associated fan opening, a vane facility for each said vent facility, each said vane facility comprising a series of elongated substantially equal length slats having relatively narrow planar uniform widths, said slats having fan air flow open and fan airflow closed positions, said slats of each vane facility having a side by side parallel adjacent relationship to each other and arranged to at least substantially cover the entire area of an associated opening when in said closed position, and each said vent facility comprising a facility constructed to pivotally support its associated slats from common opposed sides of said vent facility in a manner that airflow created by said associated fan causes movement of said associated slats in a direction relative to said associated fan to allow airflow by said associated fan through said opening of said associated fan relative to said components and in the absence of airflow from said associated fan to allow said associated slats to close off said associated fan opening preventing airflow through said associated fan opening.

2. In a computer according to claim 1, wherein said components are located at said outlet sides of said fans and each said vane facility is located at said outlet side of an associated fan, wherein said airflow created by said fans causes airflow in the direction of said components to provide cooling for said components, and wherein said vane facility is constructed and arranged, when in the position to close off said associated fan opening, to prevent air from said outlet side from passing to said inlet side of said associated fan and being recirculated by said other fan to said components.

3. In a computer according to claim 1, wherein said components are arranged at said outlet sides of said fans and wherein said components are arranged to create a relatively high density air impedance condition and a relatively high static air pressure condition at said outlet sides of said fans.

4. In a computer according to claim 1, each said facility for supporting said vane facilities includes a hinge facility constructed and arranged to allow said slats to pivot to a fan airflow open position and to a fan airflow closed position.

5. In a computer according to claim 4, wherein each said slat includes a positioning facility constructed to be operatively connected to an associated said slat in a manner to cause said associated said slat to rotate about said associated hinge facility from said open position to said closed position.

6. In a computer according to claim 5, wherein said hinge facilities comprise mechanical springs.

7. In a computer according to claim 1 wherein the computer includes an enclosure for receiving said electrical components, said fans, said vent and vane facilities and in addition at least one of the following components:

a power unit, memory units, a disk drive, a CD-ROM drive, DRAM and a processor module.

8. In a computer according to claim 1, wherein said each vent facility is rectangular in shape and each said slat extends from one side to an opposite side of an associated vent facility.

9. In a computer according to claim 1, wherein said computer includes for each said fan a plenum arranged between the said outlet sides of said fans and the most adjacent components in a manner to influence in equalizing the air pressure in the vicinity of said fans.

10. In a computer according to claim 1, wherein a said cooling fan, its associated vent and its associated vane facility comprise a fan assembly, and wherein said computer comprises an array of said fan assemblies, and a fan tray comprising a facility constructed to support said array.

11. In a computer according to claim 1, wherein each series of said slats comprise two sets of oppositely arranged slats, each said vent means having at least substantially parallel opposite sides, said sets of slats arranged to extend between said two opposite sides of an associated vent means, and each said set of slats comprising at least two slats and arranged to rotate in opposite clockwise directions relative to said slats of said other set when assuming a position to allow fan airflow and in a position to prevent fan airflow through an associated failed fan.

12. In a computer according to claim 11, wherein said slats of each set are dimensioned and arranged to form parallel elongated openings when in the position to allow fan airflow through an associated fan.

13. In a computer according to claim 11, wherein said slats of each set are dimensioned and arranged to form a relatively flat continuous closed surface when in the position to present fan airflow through an associated failed fan.

14. In a computer according to claim 1, wherein said common opposed sides of each said vent facility are formed of a generally rectangularly shaped frame.

15. In a computer according to claim 1, a cooling airflow area for said fans located to allow air to be brought to said inlet sides of said fans and discharged from said outlet sides of said fans in a manner to provide air cooling to said components.

16. In a computer comprising a number of heat generating electrical components that require cooling, at least two cooling fan means arranged adjacent to each other, means for supporting said fan means, said fan means each comprising an inlet side and an outlet side, each said fan means comprising a fan means opening, a vent means for each said fan means, a support means for each said vent means for supporting and locating each said vent means adjacent an associated said fan means, each said vent means comprising an open area aligned with and large enough to allow said airflow through an associated said fan means opening, a vane means for each said vent means, each said vane means comprising a series of elongated substantially equal length slats having relatively narrow planar uniform widths, said slats of each vane means having a side by side parallel adjacent relationship to each other and arranged to a least substantially cover the entire area of an associated opening when in a closed position, and each said vent means comprising means for pivotally supporting its associated slats from common opposed sides of said vent means in a manner that airflow created by said associated fan means causes movement of said associated slats in a direction relative to said associated fan means to allow airflow by said associated fan means through said opening of said associated fan means relative to said components and in the absence of airflow from said associated fan means to allow said associated slats to close off said associated fan means opening preventing airflow through said associated fan means opening.

17. In a computer according to claim 16, said computer comprising an airflow area for said fan means located to allow airflow to be brought to said inlet sides of said fan means and discharged to said components from said outlet sides of said fan means, wherein said slats are constructed and arranged, when in the position to close off said associated fan means opening, to prevent air from said outlet side from passing to said inlet side of said associated fan means and being recirculated by said other fan means to said components, said vent means located at said outlet side of an associated fan means, and said fan means comprising an array of cooling fan means.

18. In a computer according to claim 16, wherein said components are arranged at said outlet sides of said fan means and wherein said components are arranged to create a relatively high density air impedance condition and a relatively high static air pressure condition at said outlet sides of said fan means.

19. In a computer according to claim 17, wherein each said vane means includes at least one slat means, said vane means comprising means for supporting each said slat, said means for supporting said slats includes a hinge means constructed and arranged to allow said slats to pivot to a fan means airflow open position and to a fan means airflow closed position, and wherein each said vane means includes a mechanical spring means operatively connected to said associated slats for causing said associated slats to rotate about said associated hinge means from said open position to said closed position.

20. In a computer according to claim 16, wherein each series of said slats comprise two sets of oppositely arranged slats, each said vent means having at least substantially parallel opposite sides, said sets of slats arranged to extend between said two opposite sides of an associated vent means, and each said set of slats comprising at least two slats and arranged to rotate in opposite clockwise directions relative to said slats of said other set when assuming a position to allow fan airflow and in a position to prevent fan airflow through an associated failed fan.

21. In a computer according to claim 16, wherein said slats of each set are dimensioned and arranged to form parallel elongated openings when in the position to allow fan airflow through an associated fan.

22. In a computer according to claim 16, wherein said slats of each set are dimensioned and arranged to form a relatively flat continuous closed surface when in the position to present fan airflow through an associated failed fan.

23. In a computer according to claim 16, wherein each said means for supporting said slats includes a hinge means constructed and arranged to allow said slats to pivot to a fan means airflow open position and to a fan means airflow closed position, each said slats includes a positioning means constructed to be operatively connected to an associate slat in a manner to cause said associated slat to rotate about said associated hinge means from said open position to said closed position, and said positioning means comprising mechanical springs.

* * * * *